(12) United States Patent  
Gao

(10) Patent No.: US 12,512,320 B2  
(45) Date of Patent: Dec. 30, 2025

(54) SEMICONDUCTOR STRUCTURE AND METHOD FOR PREPARING SEMICONDUCTOR STRUCTURE

(71) Applicant: CHANGXIN MEMORY TECHNOLOGIES, INC., Hefei (CN)

(72) Inventor: Yuanhao Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 599 days.

(21) Appl. No.: 17/954,633

(22) Filed: Sep. 28, 2022

(65) Prior Publication Data

US 2023/0015991 A1    Jan. 19, 2023

Related U.S. Application Data

(63) Continuation of application No. PCT/CN2022/107412, filed on Jul. 22, 2022.

(30) Foreign Application Priority Data

Jun. 27, 2022   (CN) .......................... 202210741723.1

(51) Int. Cl.  
    *H01L 21/033*    (2006.01)

(52) U.S. Cl.  
    CPC ...... *H01L 21/0338* (2013.01); *H01L 21/0332* (2013.01); *H01L 21/0335* (2013.01); *H01L 21/0337* (2013.01)

(58) Field of Classification Search  
    CPC ............. H01L 21/0332; H01L 21/0334; H01L 21/0335; H01L 21/0337; H01L 21/0338  
    See application file for complete search history.

(56) References Cited

U.S. PATENT DOCUMENTS 10,395,976 B1 *  8/2019  Shih ................. H01L 21/32139  
10,535,532 B2    1/2020  Fan

* cited by examiner

*Primary Examiner* — Walter H Swanson  
(74) *Attorney, Agent, or Firm* — Syncoda LLC; Feng Ma

(57) ABSTRACT

A semiconductor structure and a method for preparing a semiconductor structure are provided. The method includes: a composite hard mask layer is formed on an etching layer, the composite hard mask layer including a hard mask layer and an etching stop layer surrounded by the hard mask layer; a first target pattern and a first redundant pattern are formed in the composite hard mask layer; a remaining part of the etching stop layer is removed to form a second target pattern and a second redundant pattern in the hard mask layer; etching is performed by using the second target pattern and the second redundant pattern as masks to form a target structure in the etching layer and to form a redundant structure in the hard mask layer; and a remaining part of the hard mask layer is removed.

18 Claims, 21 Drawing Sheets

SEMICONDUCTOR STRUCTURE AND METHOD FOR PREPARING SEMICONDUCTOR STRUCTURE

CROSS-REFERENCE TO RELATED APPLICATIONS

This application is a continuation application of International Patent Application No. PCT/CN2022/107412, filed on Jul. 22, 2022, which is based on and claims priority to Chinese Patent Application No. 202210741723.1, filed on Jun. 27, 2022 and entitled "SEMICONDUCTOR STRUCTURE AND METHOD FOR PREPARING SEMICONDUCTOR STRUCTURE". The disclosures of International Patent Application No. PCT/CN2022/107412 and Chinese Patent Application No. 202210741723.1 are hereby incorporated by reference in their entireties.

BACKGROUND

With the development of semiconductor technology, the etching requirement for a structure with a high aspect ratio is higher and higher. Due to the load effect of etching, insufficient etching and reduction of critical dimension are easy to occur in a part where the etching pattern is sparse.

SUMMARY

Embodiments of the disclosure relate to a semiconductor structure and a method for preparing a semiconductor structure.

In view of this, the embodiments of the disclosure relate to a semiconductor structure and a method for preparing a semiconductor structure.

According to a first aspect, the embodiments of the disclosure provide a method for preparing a semiconductor structure. The method may include that the following operations. A composite hard mask layer is formed on an etching layer, the composite hard mask layer including a hard mask layer and an etching stop layer surrounded by the hard mask layer. A first target pattern and a first redundant pattern are formed in the composite hard mask layer, in which the first target pattern is completely located in the hard mask layer and the first target pattern penetrates through a first part of the hard mask layer in a direction perpendicular to the hard mask layer, a bottom of the first redundant pattern is located in the etching stop layer, and the first redundant pattern penetrates through a part of the etching stop layer in a direction perpendicular to the etching stop layer. A remaining part of the etching stop layer is removed to form a second target pattern and a second redundant pattern in the hard mask layer. Etching is performed by using the second target pattern and the second redundant pattern as masks to form a target structure in the etching layer and to form a redundant structure in the hard mask layer. A remaining part of the hard mask layer is removed.

According to a second aspect, the embodiments of the disclosure provide a semiconductor structure, which is prepared by the following operations. A composite hard mask layer is formed on an etching layer, the composite hard mask layer including a hard mask layer and an etching stop layer surrounded by the hard mask layer. A first target pattern and a first redundant pattern are formed in the composite hard mask layer, in which the first target pattern is completely located in the hard mask layer and the first target pattern penetrates through a first part of the hard mask layer in a direction perpendicular to the hard mask layer, a bottom of the first redundant pattern is located in the etching stop layer, and the first redundant pattern penetrates through a part of the etching stop layer in a direction perpendicular to the etching stop layer. A remaining part of the etching stop layer is removed to form a second target pattern and a second redundant pattern in the hard mask layer. Etching is performed by using the second target pattern and the second redundant pattern as masks to form a target structure in the etching layer and to form a redundant structure in the hard mask layer. A remaining part of the hard mask layer is removed.

DETAILED DESCRIPTION

Figure 1A:
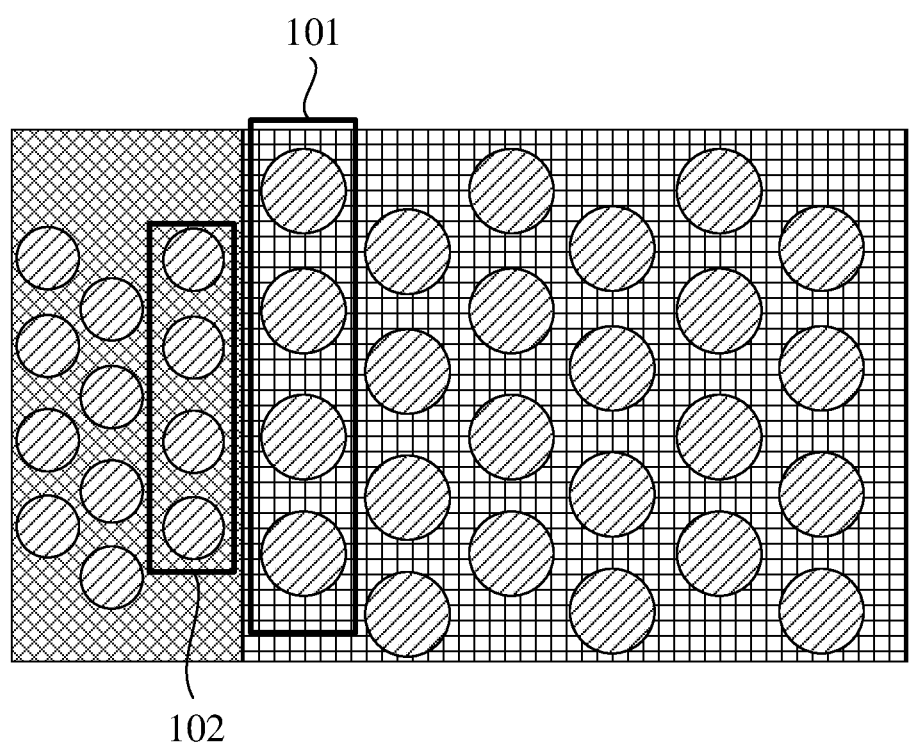
FIG. 1A is a plan view of a semiconductor structure according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the art are not described. Namely, all the features of the actual embodiments are not described here, and well-known functions and structures are not described in detail.

In the drawings, the dimensions of a layer, a region, and an element and their relative dimensions may be exaggerated for clarity. The same reference numeral represents the same element throughout the description.

It should be understood that when an element or layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, when the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. When the second element, component, region, layer or section is discussed, it does not mean that the first element, component, region, layer or section is necessarily existent in the disclosure.

A purpose of the terms used here is only to describe the specific embodiments and not as limitation to the disclosure. Herein, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

FIG. 1A illustrates a semiconductor structure, and a target pattern 101 is located on the right side of the semiconductor structure and a redundant pattern 102 is located on the left side of the semiconductor structure. Generally, the target pattern 101 is affected by the etching load effect in the etching process, resulting in the problem of insufficient etching or reduction of critical dimension. Herein, the etching load effect refers to the effect of the decrease of etching rate or uneven distribution caused by the consumption of local etching gas greater than the supply of the etching gas, thus it is necessary to introduce the redundant pattern 102 to reduce the etching load effect.

Figure 1B:
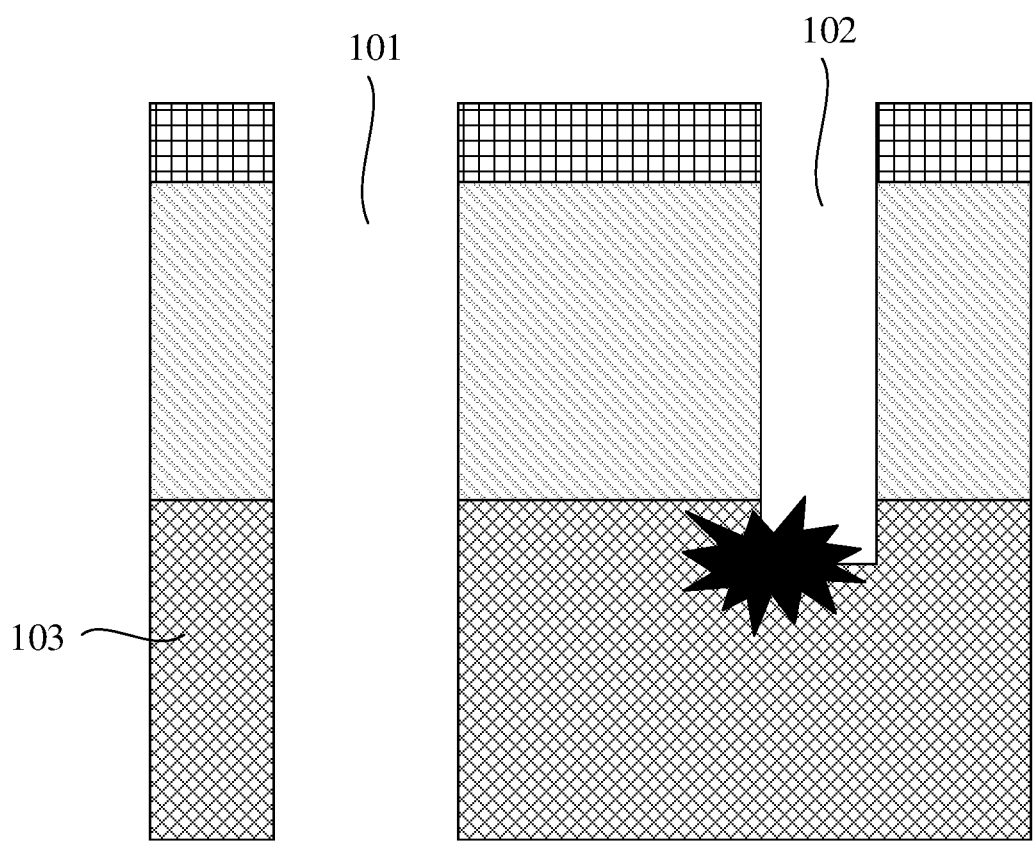
FIG. 1B is a front view of the semiconductor structure in FIG. 1A according to an embodiment of the disclosure.

However, since the aspect ratio of the target structure corresponding to the target pattern is large, the redundant pattern with a small dimension cannot effectively solve the problem of the etching load effect, while the redundant pattern with a large dimension cannot be stopped on the etching layer. It is to be seen from FIG. 1B that in the case that the redundant pattern 102 has a large dimension, the redundant pattern 102 may enter an etching layer 103 during etching, thus affecting the normal structure of the semiconductor.

Figure 1C:
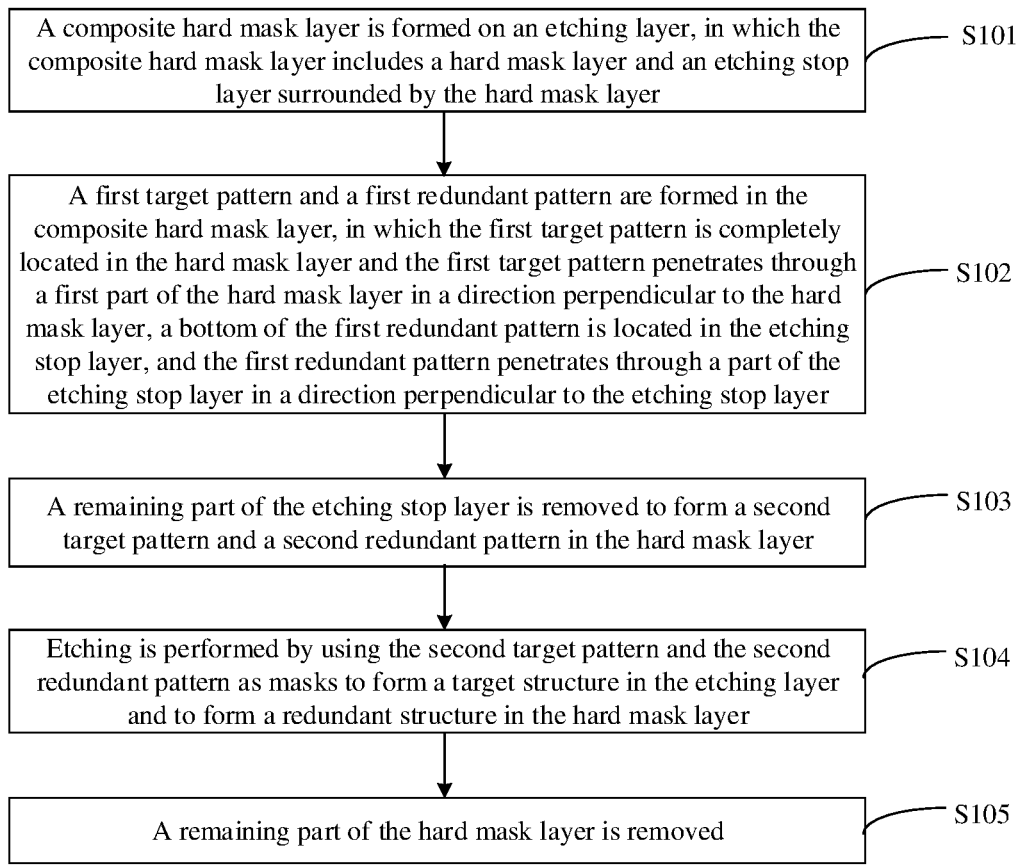
FIG. 1C is a flowchart of a method for preparing a semiconductor structure according to an embodiment of the disclosure.

Based thereon, the embodiments of the disclosure provide a method for preparing a semiconductor structure. As shown in FIG. 1C, the method includes the following operations.

At S101, a composite hard mask layer is formed on an etching layer, in which the composite hard mask layer includes a hard mask layer and an etching stop layer surrounded by the hard mask layer.

Figure 1D:
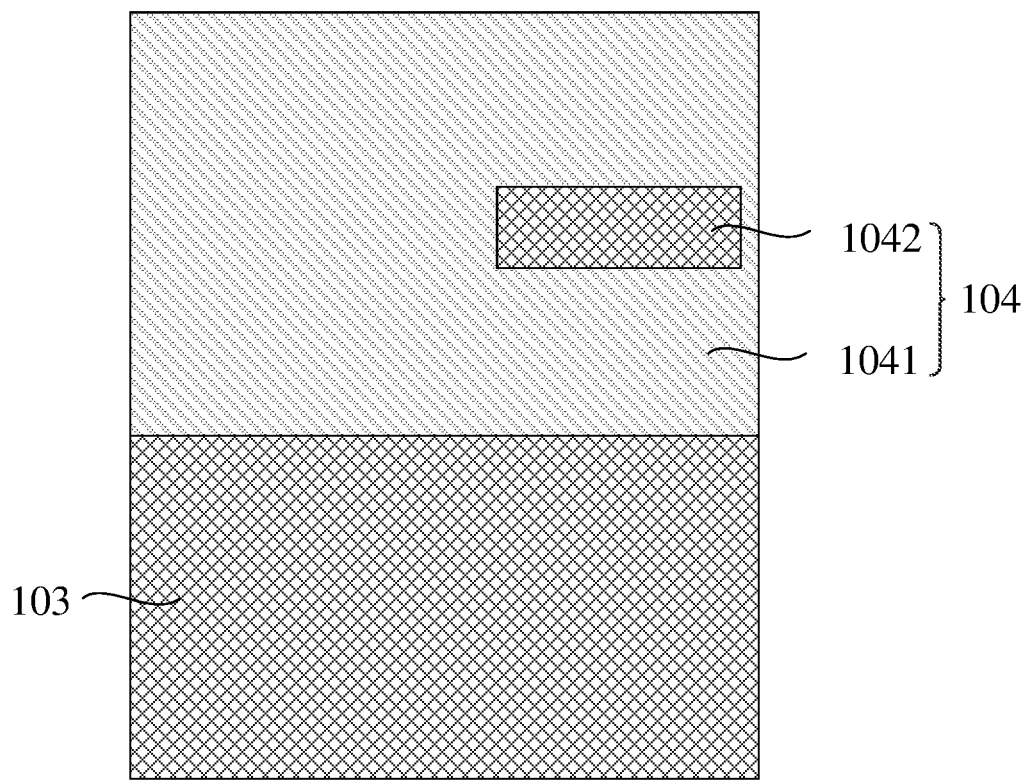
FIG. 1D is a front view of another semiconductor structure according to an embodiment of the disclosure.
Figure 1E:
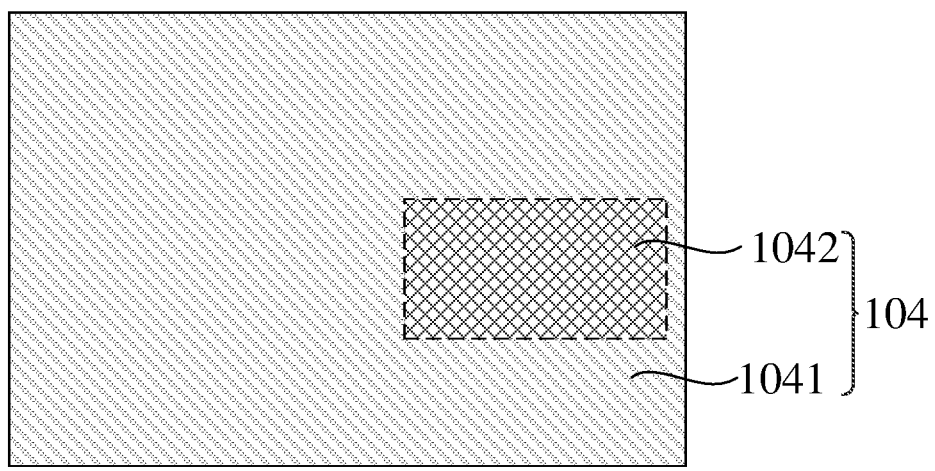
FIG. 1E is a plan view of the semiconductor structure in FIG. 1D according to an embodiment of the disclosure.

FIG. 1D is a front view of a semiconductor structure. Herein, the composite hard mask layer 104 is formed on the etching layer 103, the composite hard mask layer 104 includes a hard mask layer 1041 and an etching stop layer 1042, and the etching stop layer 1042 is surrounded by the hard mask layer 1041. FIG. 1E is a plan view of the semiconductor structure shown in FIG. 1D. It is to be seen from FIG. 1E that the whole periphery of the etching stop layer 1042 is surrounded by the hard mask layer 1041. That is, the hard mask layer 1041 is disposed around the whole periphery of the etching stop layer 1042.

Here, the etching layer is configured to be etched to form a target structure, and the target structure refers to a structure that needs to be formed in the etching layer through an etching process. The hard mask layer is configured to form a hard mask pattern of the target structure, and the material of the hard mask layer may include at least one of carbon, silicon nitride, titanium nitride or silicon oxide.

The etching stop layer is configured to stop the etching operation in the etching stop layer. The material of the etching stop layer may include at least one of silicon oxide, silicon nitride, aluminum oxide or borophosphosilicate glass. In order to stop the etching operation in the etching stop layer, the etching rate of the etching stop layer may be less than the etching rate of the hard mask layer. That is, under the same etching condition, the etching selectivity ratio of the hard mask layer to the etching stop layer may be larger, for example, 80:1, so that the etching stop layer may be basically not etched or only a small part or only a part of the etching stop layer is etched in the case that the hard mask layer is etched away. In some embodiments, the etching rate of the etching stop layer and the hard mask layer may be adjusted by changing the material compositions of the etching stop layer and the hard mask layer and the ratio among various compositions.

In some embodiments, S101 may be implemented by the following operations. A first hard mask layer is formed on the etching layer, an etching stop layer is embedded into the upper surface of the first hard mask layer, and a second hard mask layer is formed on an upper surface of the first hard mask layer and an upper surface of the etching stop layer, to form the composite hard mask layer. The method for forming the composite hard mask layer on the etching layer is not limited in the embodiment of the disclosure.

At S102, a first target pattern and a first redundant pattern are formed in the composite hard mask layer, in which the first target pattern is completely located in the hard mask layer and the first target pattern penetrates through a first part of the hard mask layer in a direction perpendicular to the hard mask layer, a bottom of the first redundant pattern is located in the etching stop layer, and the first redundant pattern penetrates through a part of the etching stop layer in a direction perpendicular to the etching stop layer. "The first target pattern penetrates through a first part of the hard mask layer" means that the first target pattern does not penetrate through the hard mask layer. "The first redundant pattern penetrates through a part of the etching stop layer" means that the first redundant pattern does not penetrate through the etching stop layer.

Figure 1F:
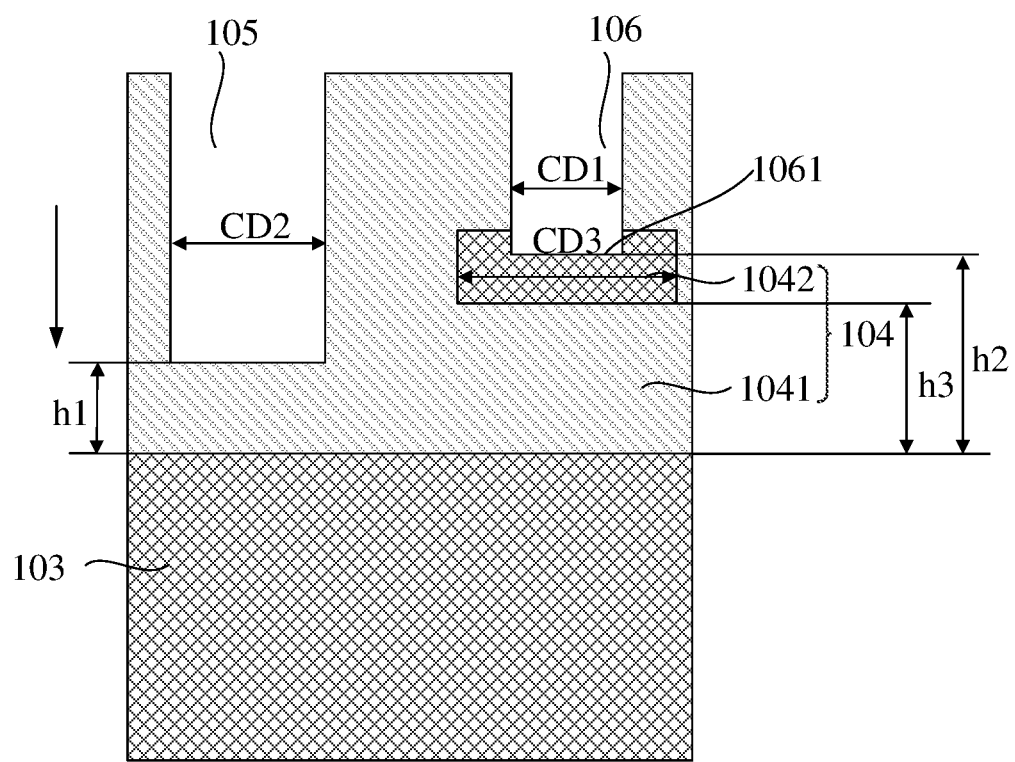
FIG. 1F to FIG. 1J are schematic diagrams illustrating a process of a method for preparing a semiconductor structure according to embodiments of the disclosure.

As shown in FIG. 1F, a first target pattern 105 and a first redundant pattern 106 are formed in the composite hard mask layer 104. The first target pattern 105 is completely located in the hard mask layer 1041, and the first target pattern 105 penetrates through a first part of the hard mask layer 1041 in a direction perpendicular to the hard mask layer 1041 (the direction indicated by the arrow in FIG. 1F, or the direction indicated by an upward arrow). That is, a certain height h1 is formed between the bottom of the first target pattern 105 and the bottom of the hard mask layer 1041. The bottom 1061 of the first redundant pattern 106 is located in the etching stop layer 1042, and the first redundant pattern 106 penetrates through a part of the etching stop layer 1042 in a direction perpendicular to the etching stop layer 1042 (the direction indicated by the arrow in FIG. 1F, or the direction indicated by an upward arrow).

Here, the first target pattern refers to a mask pattern configured to form the target structure. The first target pattern penetrates through the first part of the hard mask layer. That is, the bottom of the first target pattern is at a certain height from the bottom of the hard mask layer, so that the etching layer is protected by the hard mask layer without being polluted by the etching stop layer and the outside in the case of presence of the etching stop layer.

The first redundant pattern refers to a pattern formed in the composite hard mask layer to reduce the etching load effect. The bottom of the first redundant pattern is located in the etching stop layer. That is, the bottom of the first redundant pattern is located inside the etching stop layer, or the bottom of the first redundant pattern may be in contact with the upper surface of the etching stop layer (that is, not located inside the etching stop layer). In some embodiments, in a direction perpendicular to the etching layer, the orthographic projection of the first redundant pattern may be located within the range of orthographic projection of the pattern of the etching stop layer. Thus, the bottom of the first redundant pattern formed by the etching process may be located in the etching stop layer.

The first redundant pattern penetrates through a part of the etching stop layer. That is, the first redundant pattern stops in the etching stop layer or on the upper surface of the etching stop layer during the etching process. In some embodiments, the etching rate of the etching stop layer may be less than the etching rate of the hard mask layer. Therefore, under the same etching condition, the etching depth of the etching stop layer is less than the etching depth of the hard mask layer, so that the etching stop layer may stop the etching in the process of etching the first redundant pattern, thereby stopping the first redundant pattern in the etching stop layer.

In some embodiments, as shown in FIG. 1F, the critical dimension CD2 of the first target pattern 105 is greater than the critical dimension CD1 of the first redundant pattern 106 in a direction parallel to a bottom surface of the composite hard mask layer 104, and the first distance h1 between the bottom of the first target pattern 105 and the bottom surface of the composite hard mask layer 104 is less than the second distance h2 between the bottom of the first redundant pattern 106 and the bottom surface of the composite hard mask layer 104.

Here, the critical dimension refers to the dimension that affects the performance of the structure and needs to be controlled emphatically. The critical dimension may be determined according to the shape of the structure and the production process. For example, for the etching process, when the structure is cylindrical, the diameter of a surface circle is the critical dimension (that is, the situation shown in FIG. 1F). When the structure is a cube, the side length is the critical dimension.

Generally, for the etching process, when the critical dimension of the first redundant pattern is less than the critical dimension of the first target pattern in the direction parallel to the bottom surface of the composite hard mask layer, it is possible to reduce the etching load effect in the process of forming the target structure through the first redundant pattern. Therefore, the critical dimension of the first redundant pattern may be less than the critical dimension of the first target pattern in the direction parallel to the bottom surface of the composite hard mask layer. That is, the critical dimension of the first target pattern is greater than the critical dimension of the first redundant pattern. Since the critical dimension of the first target pattern is greater than the critical dimension of the first redundant pattern, the etching depth of the first target pattern is greater than the etching depth of the first redundant pattern under the same etching condition. Therefore, the first distance between the bottom of the first target pattern and the bottom surface of the composite hard mask layer is less than the second distance between the bottom of the first redundant pattern and the bottom surface of the composite hard mask layer.

In some embodiments, as shown in FIG. 1F, in the direction parallel to the bottom surface of the composite hard mask layer 104, the critical dimension CD1 of the first redundant pattern 106 is less than the critical dimension CD3 of the etching stop layer 1042. Since the critical dimension of the first redundant pattern is less than the critical dimension of the etching stop layer, the etching stop layer can support the first redundant pattern in the process of etching the first redundant pattern, and the first redundant pattern can be stopped in the etching stop layer or on the upper surface of the etching stop layer.

In some embodiments, as shown in FIG. 1F, the first distance h1 between the bottom of the first target pattern 105 and the bottom surface of the composite hard mask layer 104 is less than a third distance h3 between the bottom of the etching stop layer 1042 and the bottom surface of the composite hard mask layer 104.

Figure 1G:
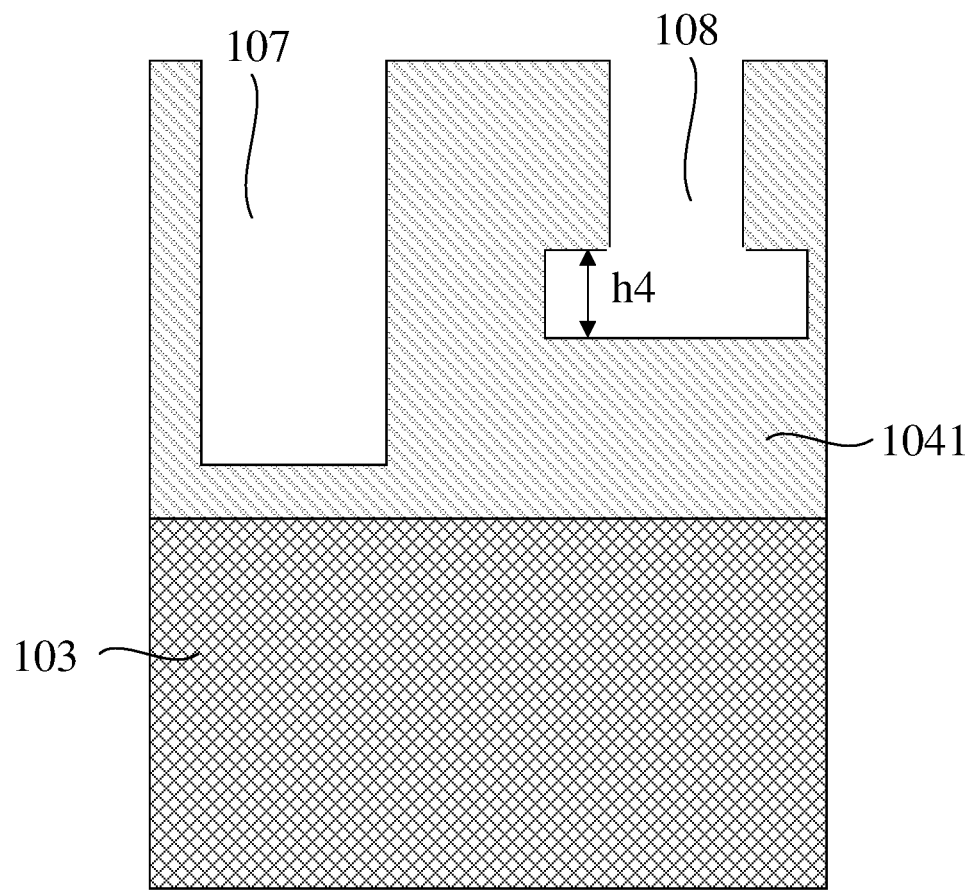
Figure 1H:
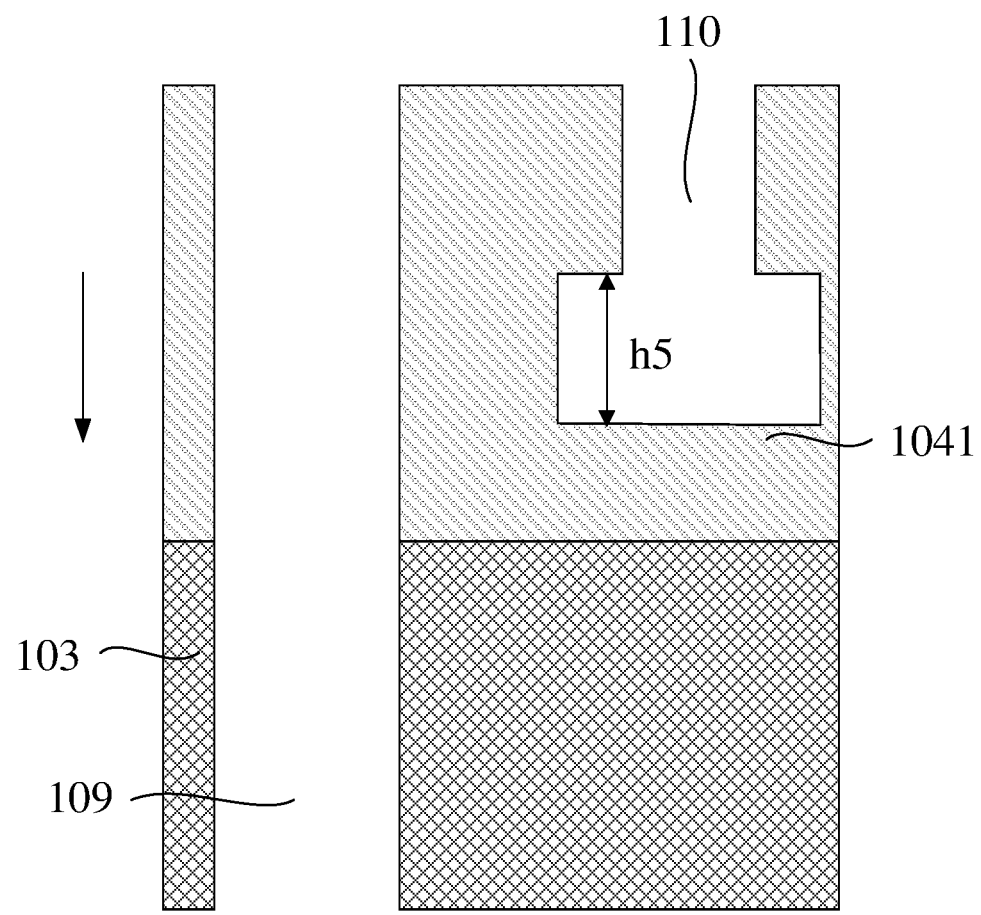
Figure 1I:
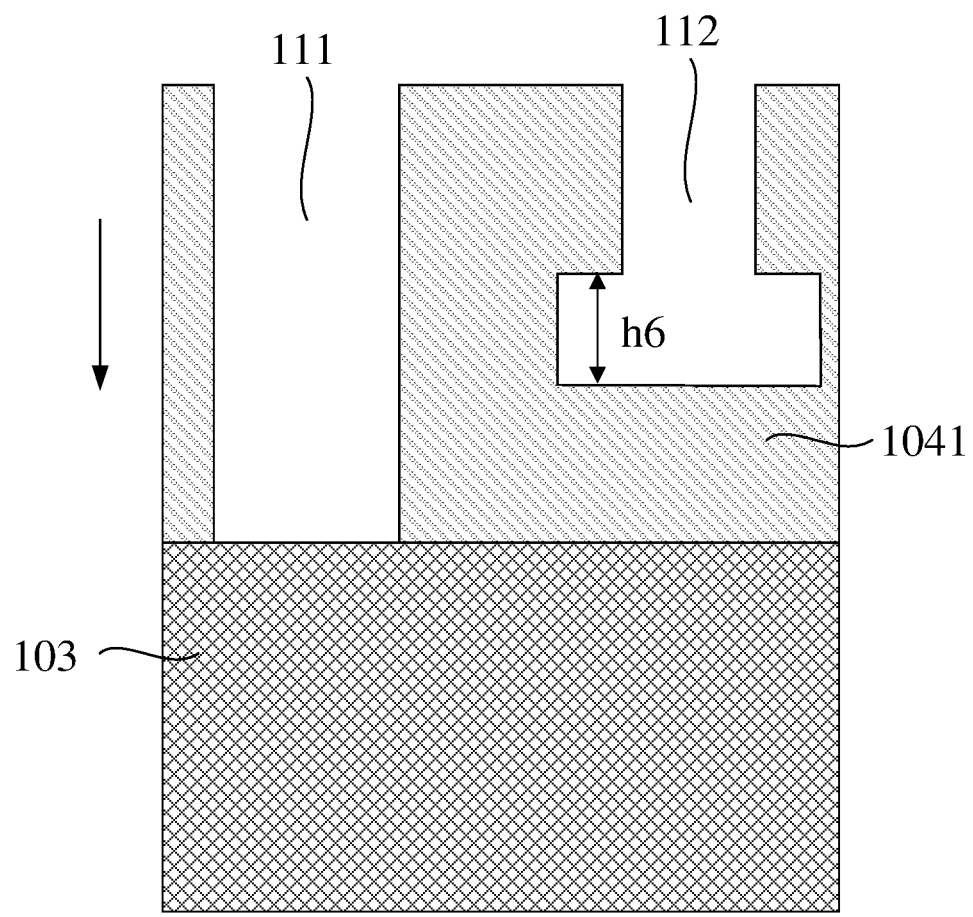
Figure 1J:
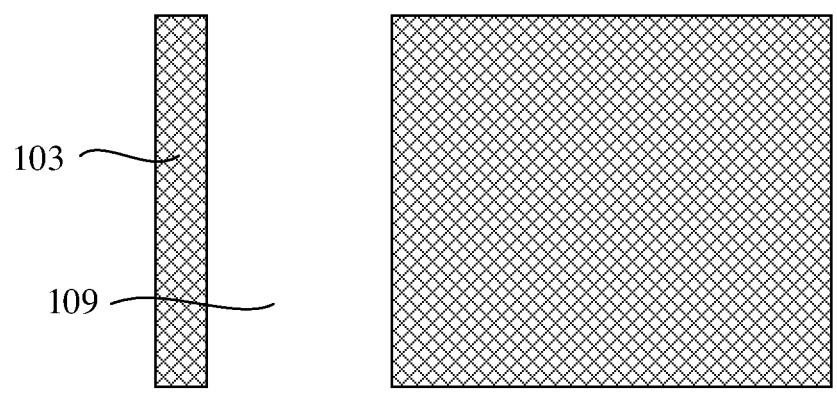

Here, in order to form the target structure, the etching stop layer is generally removed first to form a second redundant pattern 108 including an area where the etching stop layer is located as shown in FIG. 1G. That is, the bottom of the second redundant pattern 108 may be approximately equal to the bottom of the etching stop layer. The hard mask layer and the etching layer are etched by using the first target pattern as a mask later to form a third target pattern 111 as shown in FIG. 1I and a target structure 109 as shown in FIG. 1J in the subsequent operation. The hard mask layer 1041 is etched by using the second etching pattern 108 as a mask to form a redundant structure 110 as shown in FIG. 1H. It is to be seen that the etching depth of the first target pattern 105 on the left side in FIG. 1F in the process of forming the target structure 109 as shown in FIG. 1J is greater than the etching depth of the first redundant pattern 106 and the etching stop layer 1042 on the right side in the process of forming the redundant structure 110 as shown in FIG. 1H. In order to keep the formed redundant structure in the hard mask layer in the process of forming the target structure 109 as shown in FIG. 1J, the first distance h1 between the bottom of the first target pattern 105 and the bottom surface of the composite hard mask layer 104 is enabled to be less than the third distance h3 between the bottom of the etching stop layer 1042 and the bottom surface of the composite hard mask layer 104. Thus, at a large third distance h3, enough space may be provided for forming a redundant structure.

In some embodiments, S102 may be implemented by the following operations. A photoresist layer is formed on the composite hard mask layer, the photoresist layer is patterned to form a mask pattern with a first target pattern and a first redundant pattern, and then the composite hard mask layer is etched by using the mask pattern as a mask to form the first target pattern and the first redundant pattern.

At S103, a remaining part of the etching stop layer is removed to form a second target pattern and a second redundant pattern in the hard mask layer.

A remaining part of the etching stop layer 1042 as shown in FIG. 1F is removed to form a second target pattern 107 and a second redundant pattern 108 as shown in FIG. 1G in the hard mask layer 1041.

Here, the second target pattern refers to a pattern which is formed by the first target pattern after the process of removing the remaining part of the etching stop layer is performed. That is, the second target pattern 107 has a correspondence with the first target pattern 105 in FIG. 1F.

The second redundant pattern refers to a pattern which is formed by the first redundant pattern after the process of removing the remaining part of the etching stop layer is performed. In the case of strictly controlling the process, only the remaining part of the etching stop layer is removed in S103, in which the hard mask layer located below the etching stop layer is not removed, that is, the situation shown in FIG. 1F. The second redundant pattern 108 includes the etching stop layer 1042 (with a height h4) and the first redundant pattern 106. Certainly, in some embodiments, in addition to removing the remaining part of the etching stop layer, S103 may also include the operation that a small part of the hard mask layer located below the etching stop layer is also removed.

Since the bottom of the first redundant pattern is located inside the etching stop layer or on the upper surface of the etching stop layer, that is, a part of the etching stop layer is located directly below the hard mask layer, the etching stop layer cannot be effectively removed through the dry etching process. Therefore, the remaining part of the etching stop layer may be removed through a wet etching process in the implementation of S103. Herein, etchant used in the wet etching process may be a mixture of hydrofluoric acid, nitric acid and acetic acid or potassium hydroxide, etc. The type of the etchant used in the wet etching is not limited in the embodiment of the disclosure. In the embodiment of the disclosure, by adopting the wet etching process, the etching stop layer may be conveniently and quickly removed, and the residual amount of the etching stop layer is reduced.

In the process of removing the etching stop layer through the wet etching process, the following two conditions need to be met.

First, the etching rate of an etching solution to the etching stop layer is greater than the etching rate of the etching solution to the hard mask layer, so that in the process of removing the etching stop layer, only a small part of the hard mask layer is etched, but not completely removed.

Second, in the direction perpendicular to the hard mask layer, the second target pattern penetrates through a second part of the hard mask layer, and the second redundant pattern penetrates through a third part of the hard mask layer. As shown in FIG. 1G, in the direction perpendicular to the hard mask layer 1041 (with reference to FIG. 1F for understanding), the second target pattern 107 penetrates through a second part of the hard mask layer 1041, and the second redundant pattern 108 penetrates through a third part of the hard mask layer 1041, so that the etching layer can be kept intact under the protection of the non-penetrating hard mask layer without affecting the formation of the target structure of the etching layer. "The second target pattern penetrates through a second part of the hard mask layer" means that the second target pattern does not penetrate through the hard mask layer. "The second redundant pattern penetrates through a third part of the hard mask layer" means that the second redundant pattern does not penetrate through the hard mask layer.

At S104, etching is performed by using the second target pattern and the second redundant pattern as masks to form a target structure in the etching layer and to form a redundant structure in the hard mask layer.

Etching is performed by using the second target pattern 107 and the second redundant pattern 108 in FIG. 1G as masks to form a target structure 109 as shown in FIG. 1H in the etching layer 103 and to form a redundant structure 110 as shown in FIG. 1H in the hard mask layer 1041. Herein, the redundant structure 110 is deeper in the depth direction than the second redundant pattern 108 in FIG. 1G. That is, the height h5 of the redundant structure 110 is greater than the height h4 of the second redundant pattern 108.

Here, S104 may be implemented by the following operation. The etching is performed by using the second target pattern and the second redundant pattern as masks though a dry etching process, to form a target structure in the etching layer and to form a redundant structure in the hard mask layer. Herein, the dry etching process may include a reactive ion etching technique, a plasma etching technique, deep reactive ion etching and $XeF_2$ isotropic etching, etc. The type of the dry etching process is not limited in the embodiment of the disclosure.

In some embodiments, S104 may include S1041 and S1042 as follows.

At S1041, etching is performed by using the second target pattern and the second redundant pattern as masks. Herein, the hard mask layer is etched by using the second target pattern as a mask to form a third target pattern in the hard mask layer, in which the third target pattern penetrates through the hard mask layer in the direction perpendicular to the hard mask layer. The hard mask layer is etched by using the second redundant pattern as a mask to form a third redundant pattern in the hard mask layer, in which the third redundant pattern is located in the hard mask layer and penetrates through a fourth part of the hard mask layer in the direction perpendicular to the hard mask layer. "The third redundant pattern penetrates through a fourth part of the hard mask layer" means that the third redundant pattern does not penetrate through the hard mask layer.

As shown in FIG. 1G, the hard mask layer 1041 is etched by using the second target pattern 107 as a mask to form a third target pattern 111 as shown in FIG. 1I in the hard mask layer 1041. As shown in FIG. 1I, the third target pattern 111 penetrates through the hard mask layer 1041 in the direction perpendicular to the hard mask layer 1041 (that is, the direction indicated by the arrow in FIG. 1I, or the direction indicated by an upward arrow).

As shown in FIG. 1G, the hard mask layer 1041 is etched by using the second redundant pattern 108 as a mask to form a third redundant pattern 112 shown in FIG. 1I in the hard mask layer 1041. As shown in FIG. 1I, in the direction perpendicular to the hard mask layer 1041, the third redundant pattern 112 is located in the hard mask layer 1041 and penetrates through a fourth part of the hard mask layer 1041. Herein, the third redundant pattern 112 is deeper in the depth direction than the second redundant pattern 108 in FIG. 1G and shallower in the depth direction than the redundant structure 110 in FIG. 1H. That is, the height h6 of the third redundant pattern 112 is greater than the height h4 of the second redundant pattern 108, but less than the height h5 of the redundant structure 110.

Herein, the third target pattern is a target pattern penetrating through the hard mask layer in the direction perpendicular to the hard mask layer. Since the bottom area of an area of the second redundant pattern where the etching stop layer is located is large, the etching speed of the second redundant pattern is less than the etching speed of the second target pattern in the process of simultaneous etching by using the second redundant pattern and the second target pattern as masks, so that the obtained third target pattern may penetrate through the hard mask layer, but the third redundant pattern penetrates through a fourth part of the hard mask layer.

At S1042, etching is performed by using the third target pattern and the third redundant pattern as masks. Herein, the etching layer is etched by using the third target pattern as a mask to form a target structure in the etching layer; and the hard mask layer is etched by using the third redundant pattern as a mask to form a redundant structure in the hard mask layer. The redundant structure is located in the hard mask layer and penetrates through a fifth part of the hard mask layer in the direction perpendicular to the hard mask layer.

As shown in FIG. 1I, the etching layer 103 is etched by using the third target pattern 111 as a mask to form the target structure 109 as shown in FIG. 1H in the etching layer 103.

As shown in FIG. 1I, the hard mask layer 1041 is etched by using the third redundant pattern 112 as a mask to form the redundant structure 110 as shown in FIG. 1H in the hard mask layer 1041. In the direction perpendicular to the hard mask layer 1041 (that is, the direction indicated by the arrow in FIG. 1H, or the direction indicated by an upward arrow), the redundant structure 110 is located in the hard mask layer 1041 and penetrates through a fifth part of the hard mask layer 1041.

Here, in order to enable the redundant structure to be located in the hard mask layer and to penetrate through the fifth part of the hard mask layer while the target structure is formed in the etching layer in the process of performing etching by using the third target pattern and the third redundant pattern as masks, S1042 may be implemented by the following manner. The etching rate for the etching layer is greater than the etching rate for the hard mask layer, so that a small part of the redundant structure is etched away and the redundant structure is still located in the hard mask layer and penetrates through the fifth part of the hard mask layer in the process of performing etching by using the third target pattern and the third redundant pattern as masks. In some embodiments, the etching rate for the etching layer and the hard mask layer may be adjusted by adjusting the composition and proportion of the materials of the etching layer and the hard mask layer.

In the embodiment of the disclosure, by controlling the etching rate for the etching layer and the etching rate for the hard mask layer, the redundant structure is located in the hard mask layer and penetrates through the fifth part of the hard mask layer while the target structure is formed in the etching layer, thus facilitating the subsequent removal of the redundant structure. "The redundant structure penetrates through the fifth part of the hard mask layer" means that the redundant structure does not penetrates through the hard mask layer.

At S105, a remaining part of the hard mask layer is removed.

A remaining part of the hard mask layer 1041 as shown in FIG. 1H is removed to form the etching layer 103 containing the target structure 109 as shown in FIG. 1J.

Here, in the implementation of S105, a remaining part of the hard mask layer may be removed through a dry etching process or a wet etching process, to obtain an etching layer with a target structure.

In the embodiment of the disclosure, a composite hard mask layer is formed on an etching layer. Herein, the composite hard mask layer includes a hard mask layer and an etching stop layer surrounded by the hard mask layer. Then, a first target pattern and a first redundant pattern are formed in the composite hard mask layer, the bottom of the first redundant pattern is located in the etching stop layer, and the first redundant pattern penetrates through a part of the etching stop layer in the direction perpendicular to the etching stop layer. The remaining part of the etching stop layer is removed, to form a second target pattern and a second redundant pattern in the hard mask layer. Etching is performed by using the second target pattern and the second redundant pattern as masks, to form a target structure in the etching layer and to form a redundant structure in the hard mask layer. Finally, the remaining part of the hard mask layer is removed to form an etching layer with a target structure. Thus, in the first aspect, by embedding the etching stop layer in the hard mask layer and forming the first redundant pattern above the etching stop layer, the first redundant pattern may be stopped on the etching stop layer under the action of the etching stop layer. In the second aspect, after the first redundant pattern is formed, the etching stop layer is removed, which may reduce the pollution of the etching stop layer to a subsequent process. In the third aspect, by introducing a redundant structure, the load effect in the etching process may be reduced in the process of etching a high aspect ratio structure on the semiconductor structure.

In some embodiments, the operation S101 "a composite hard mask layer is formed on an etching layer, in which the composite hard mask layer includes a hard mask layer and an etching stop layer surrounded by the hard mask layer" may include S1011 and S1012 as follows.

At S1011, a first hard mask layer and the etching stop layer are sequentially formed on the etching layer, in which the etching stop layer is embedded in the first hard mask layer, and a top surface of the first hard mask layer is flush with a top surface of the etching stop layer.

Figure 2A:
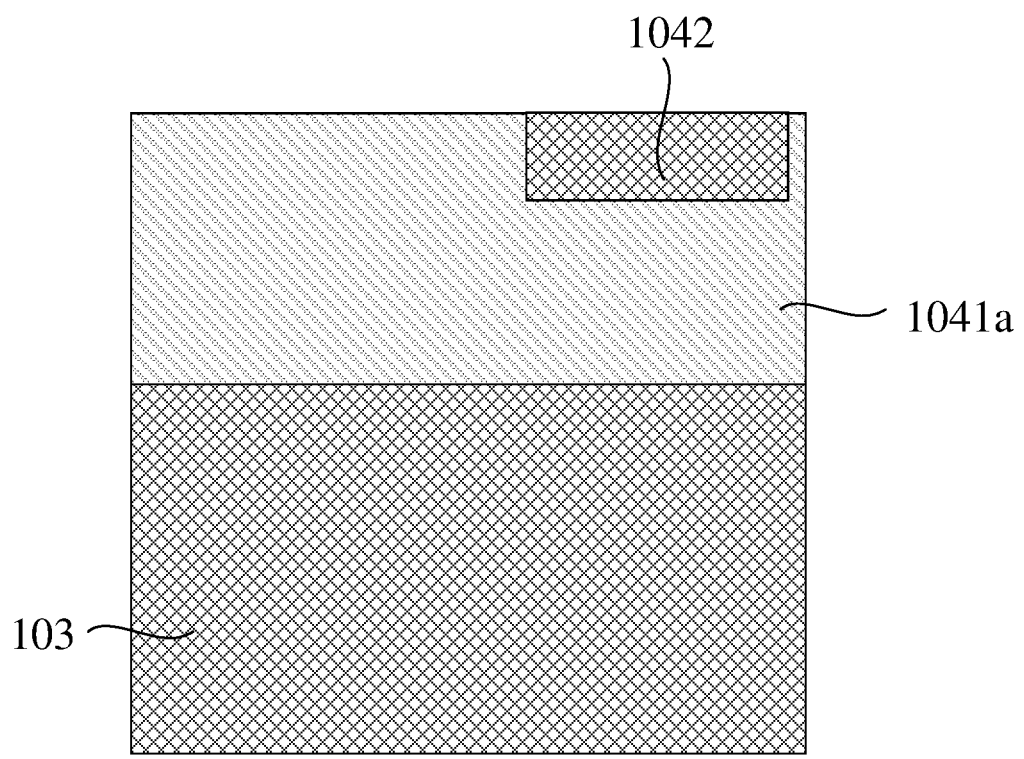
FIG. 2A to FIG. 2H are schematic diagrams illustrating a process for forming a composite hard mask layer on an etching layer according to embodiments of the disclosure.

As shown in FIG. 2A, a first hard mask layer 1041a and the etching stop layer 1042 are sequentially formed on the etching layer 103. Herein, the etching stop layer 1042 is embedded in the first hard mask layer 1041a, and the top surface of the first hard mask layer 1041a is flush with the top surface of the etching stop layer 1042.

Here, the expression that the etching stop layer is embedded in the first hard mask layer means that the etching stop layer is located in the first hard mask layer except the top surface of the etching stop layer. In some embodiments, in the direction parallel to the top surface of the first hard mask layer, the horizontal dimension of the first hard mask layer is greater than the horizontal dimension of the etching stop layer, so that the etching stop layer can be embedded in the first hard mask layer.

In some embodiments, the material of the first hard mask layer may include at least one of carbon, silicon nitride, titanium nitride or silicon oxide. The material of the first hard mask layer is different from the material of the etching stop layer, so that the etching rate of the first hard mask layer is different from the etching rate of the etching stop layer under the same etching condition. The etching condition of the etching stop layer or the first hard mask layer is adjusted by controlling the type of the material of the first hard mask layer and the type of the material of the etching stop layer.

At S1012, a second hard mask layer, which covers the top surface of the first hard mask layer and the top surface of the etching stop layer, is formed to form the composite hard mask layer located on the etching layer.

Figure 2B:
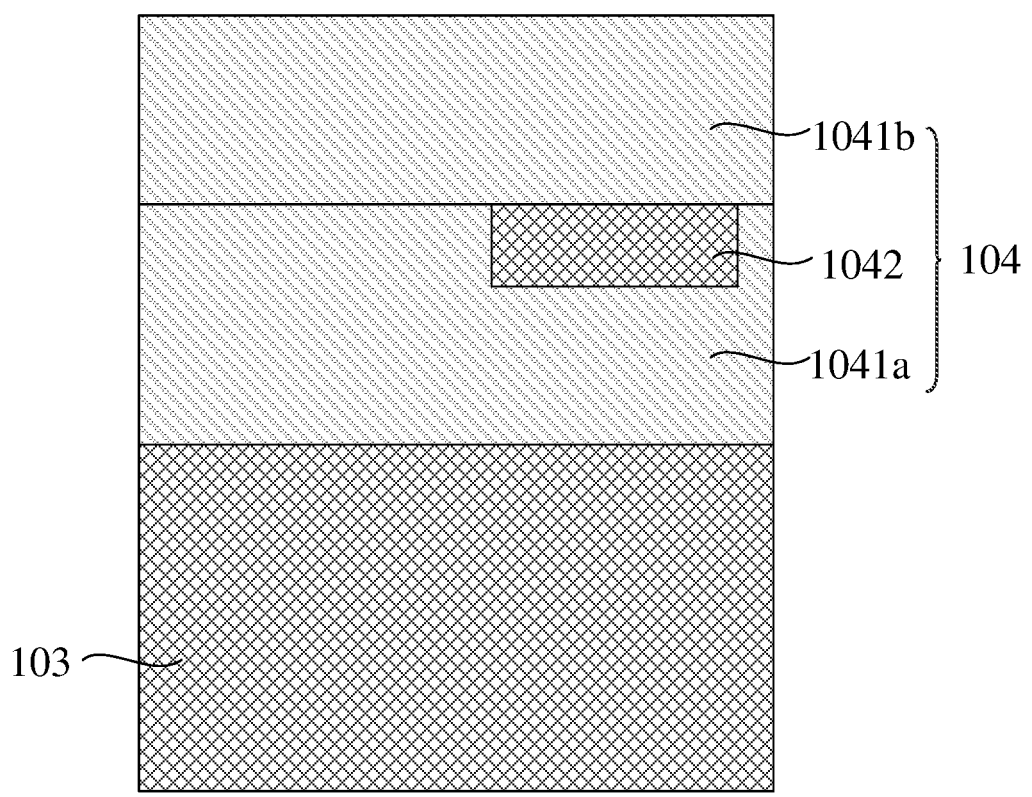

As shown in FIG. 2B, a second hard mask layer 1041b is formed on the top surface of the first hard mask layer 1041a and the top surface of the etching stop layer 1042, to form a composite hard mask layer 104 located on the etching layer 103. Herein, the composite hard mask layer 104 includes the first hard mask layer 1041a, the etching stop layer 1042 and the second hard mask layer 1041b.

In some embodiments, in the implementation of S1012, a second hard mask layer is formed on the etching layer by a deposition process. The deposition process includes any of the following: Chemical Vapor Deposition (CVD), Physical Vapor Deposition (PVD), Atomic Layer Deposition (ALD) and any other suitable deposition process. The material of the second hard mask layer may include at least one of carbon, silicon nitride, titanium nitride or silicon oxide. The material of the second hard mask layer is different from the material of the etching stop layer, so that the etching rate of the second hard mask layer is different from the etching rate of the etching stop layer under the same etching condition. The etching condition of the etching stop layer or the second hard mask layer is adjusted by controlling the type of the material of the second hard mask layer and the type of the material of the etching stop layer. In some embodiments, the material of the second hard mask layer may be the same as the material of the first hard mask layer and may also be different from the material of the first hard mask layer.

For the above operation S1011, in some embodiments, the implementation of S1011 may include S1011a and S1011b as follows.

At S1011a, the first hard mask layer and an etching stop layer trench are sequentially formed on the etching layer, in which the etching stop layer trench is located in the first hard mask layer.

Figure 2C:
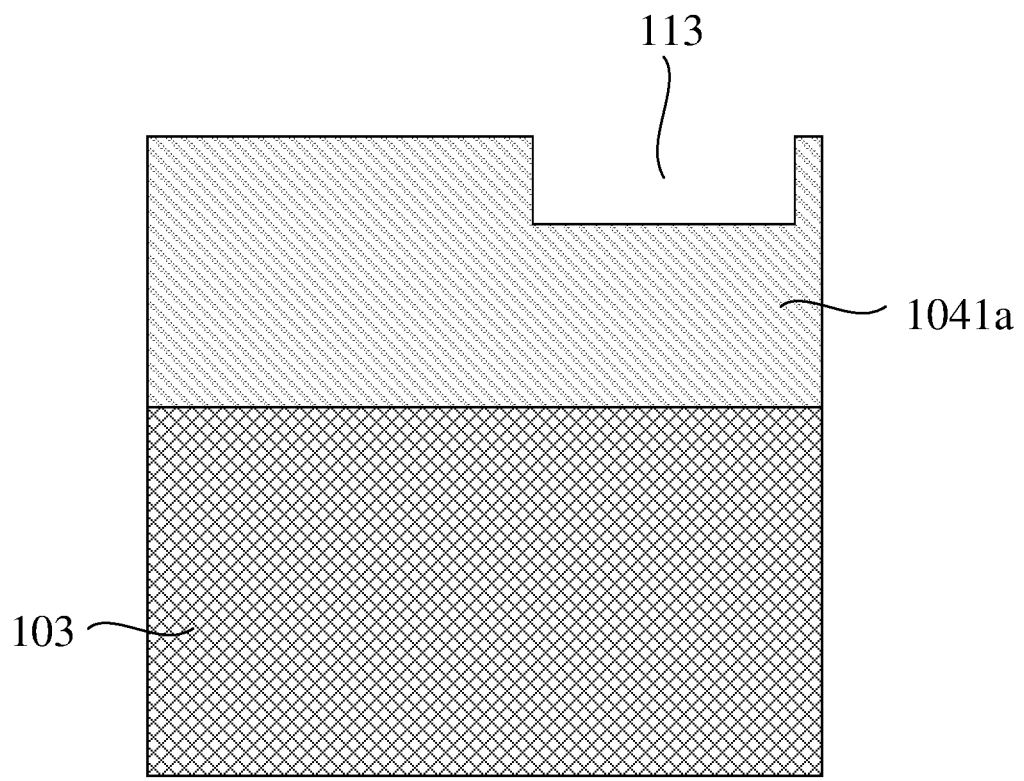

As shown in FIG. 2C, a first hard mask layer 1041a and an etching stop layer trench 113 are sequentially formed on the etching layer 103. Herein, the etching stop layer trench 113 is located in the first hard mask layer 1041a.

In some embodiments, the implementation of S1011a may include S11a1 to S11a5 as follows.

At S11a1, an initial first hard mask layer is formed on the etching layer.

Figure 2D:
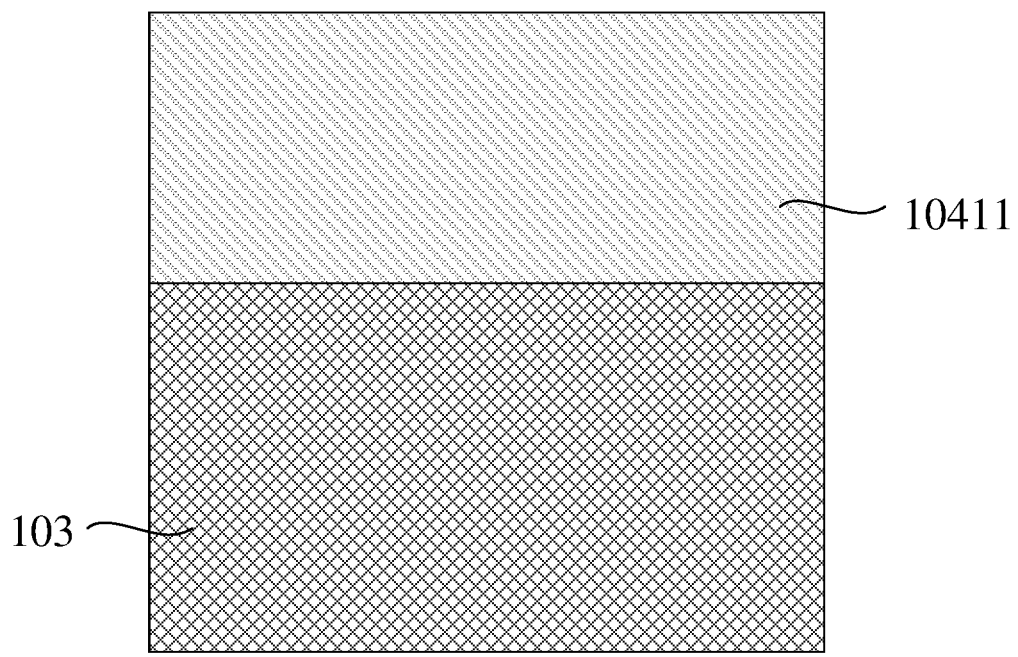

As shown in FIG. 2D, an initial first hard mask layer 10411 is formed on the etching layer 103, that is, a hard mask layer without an etching stop layer trench is formed.

Herein, in the implementation of S11a1, an initial first hard mask layer may be formed on the etching layer by a deposition process. The deposition process includes any of the following: Chemical Vapor Deposition (CVD), Physical Vapor Deposition (PVD), Atomic Layer Deposition (ALD) and any other suitable deposition process.

At S11a2, a first photoresist layer is formed on the initial first hard mask layer.

Figure 2E:
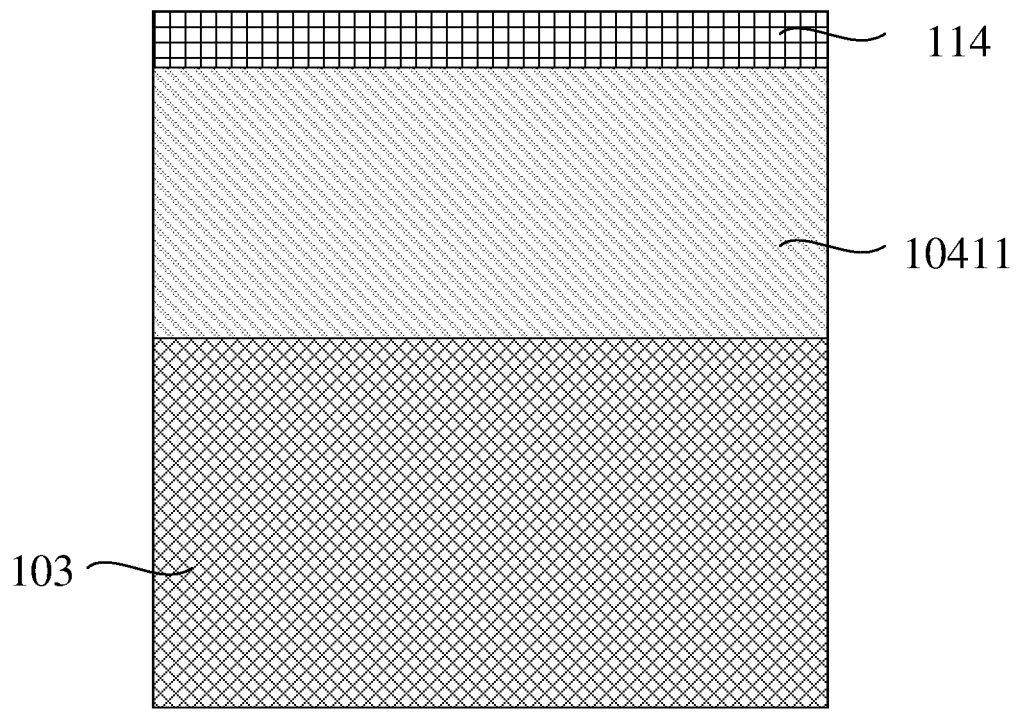

As shown in FIG. 2E, a first photoresist layer 114 is formed on the initial first hard mask layer 10411.

Here, PR, also known as a photoresist, refers to a corrosion-resistant etching film material, the solubility of which changes through irradiation or radiation of ultraviolet light, an electron beam, an ion beam, an X-ray, etc. The photoresist is sensitive to light, including components such as photosensitive resin, sensitizer and solvent. In the process of photolithography, the photoresist is used as an anti-corrosion coating material.

At S11a3, the first photoresist layer is patterned to form a first etching stop layer pattern.

Figure 2F:
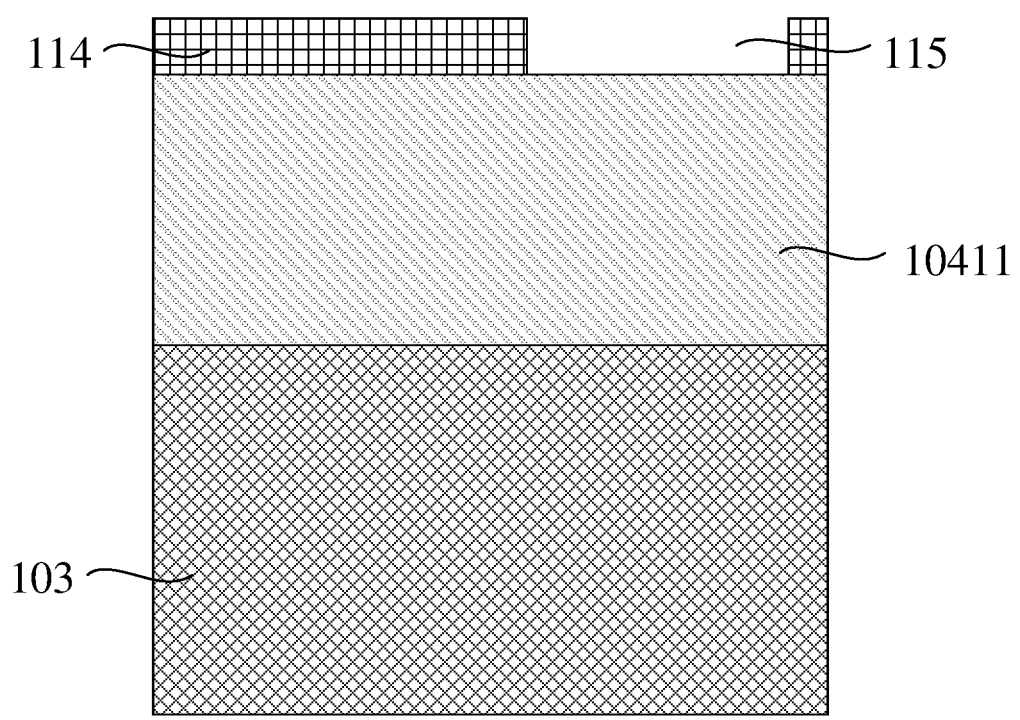

As shown in FIG. 2F, the first photoresist layer 114 is patterned to form a first etching stop layer pattern 115. Herein, the first etching stop layer pattern 115 is configured to form an etching stop layer through etching.

Here, the operation that the photoresist layer is patterned means that the photoresist layer is exposed and developed, to dissolve a part of the photoresist layer. The undissolved part of the photoresist layer forms a mask pattern, and a first window in the mask pattern is the first etching stop layer pattern.

At S11a4, the initial first hard mask layer is etched by using the first etching stop layer pattern as a mask to form the first hard mask layer and the etching stop layer trench located in the first hard mask layer.

Figure 2G:
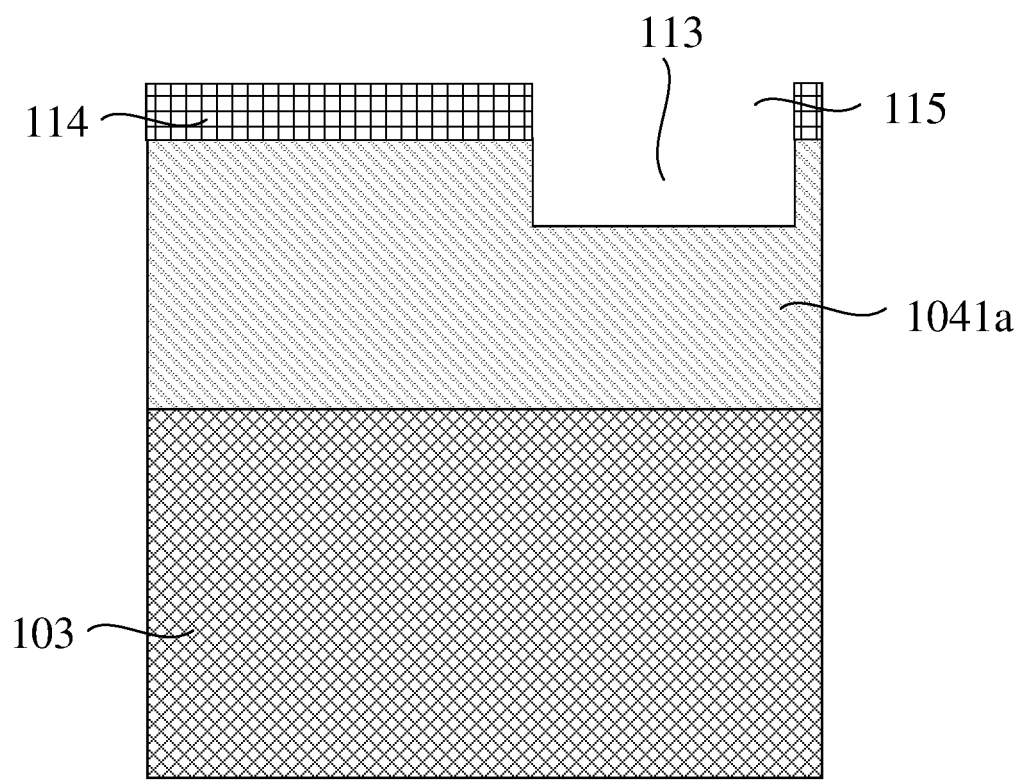

As shown in FIG. 2F, the initial first hard mask layer 10411 is etched by using the first etching stop layer pattern 115 as a mask to form the first hard mask layer 1041a and the etching stop layer trench 113 located in the first hard mask layer 1041a as shown in FIG. 2G.

Here, the first hard mask layer is a hard mask layer which is formed after an etching stop layer trench is formed in the initial first hard mask layer.

At S11a5, the first photoresist layer is removed.

As shown in FIG. 2G, the first photoresist layer 114 is removed to form a structure shown in FIG. 2C.

Here, in S11a5, the first photoresist layer may be removed through a dry etching process or a wet etching process.

At S1011b, an etching stop layer completely filling the etching stop layer trench is deposited in the etching stop layer trench.

As shown in FIG. 2C, an etching stop layer 1042 completely filling the etching stop layer trench 113 shown in FIG. 2A is deposited in the etching stop layer trench 113.

Here, in the implementation of S1011b, an etching stop layer may be formed in the etching stop layer trench by a deposition process. The deposition process includes any of the following: Chemical Vapor Deposition (CVD), Physical Vapor Deposition (PVD), Atomic Layer Deposition (ALD) and any other suitable deposition process. Herein, the thickness of a deposited layer formed by ALD is extremely uniform and the consistency thereof is extremely excellent.

In some embodiments, the implementation of S1011b may include S11b1 and S11b2 as follows.

At S11b1, an initial etching stop layer is deposited in the etching stop layer trench and on the top surface of the first hard mask layer.

Figure 2H:
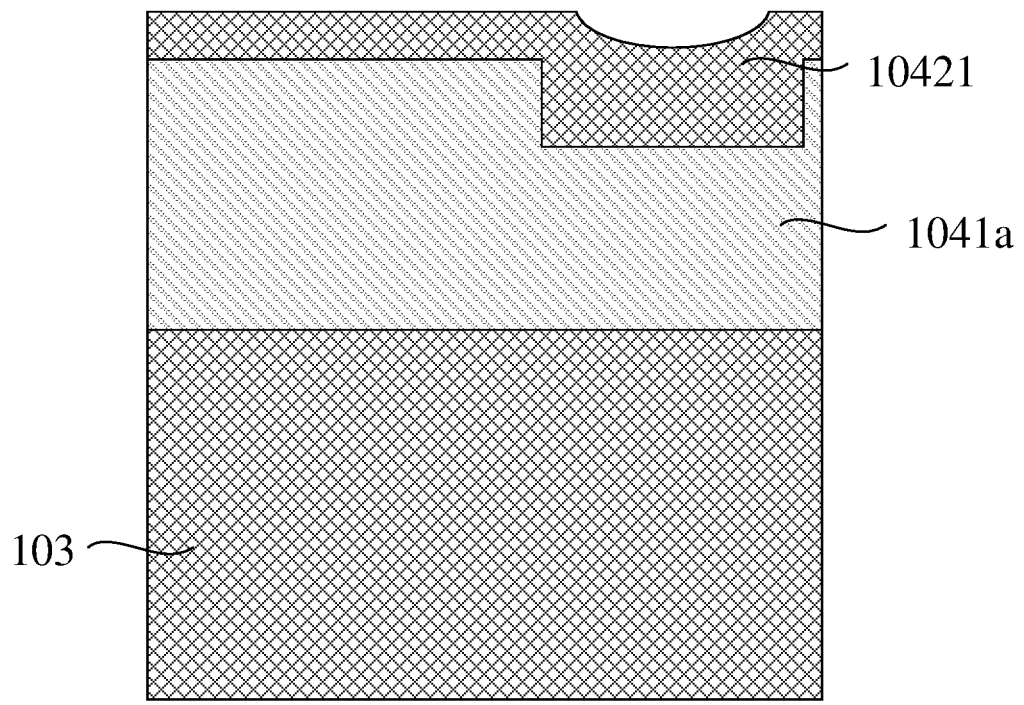

As shown in FIG. 2C, an initial etching stop layer 10421 shown in FIG. 2H is deposited in the etching stop layer trench 113 and on the top surface of the first hard mask layer 1041a.

At S11b2, the initial etching stop layer located on the top surface of the first hard mask layer is removed, so that a top surface of a remaining part of the initial etching stop layer is flush with the top surface of the first hard mask layer to form the etching stop layer.

As shown in FIG. 2H, the initial etching stop layer 10421 located on the top surface of the first hard mask layer 1041a is removed, so that the top surface of the remaining part of the initial etching stop layer 10421 is flush with the top surface of the first hard mask layer 1041a to form the etching stop layer 1042 shown in FIG. 2A.

Here, in the implementation of S11b2, the initial etching stop layer located on the top surface of the first hard mask layer may be removed by chemical mechanical polishing.

In some embodiments, the operation S102 that the first target pattern and the first redundant pattern are formed in the composite hard mask layer may include S1021 to S1024 as follows.

At S1021, a second photoresist layer is formed on the composite hard mask layer.

Figure 3A:
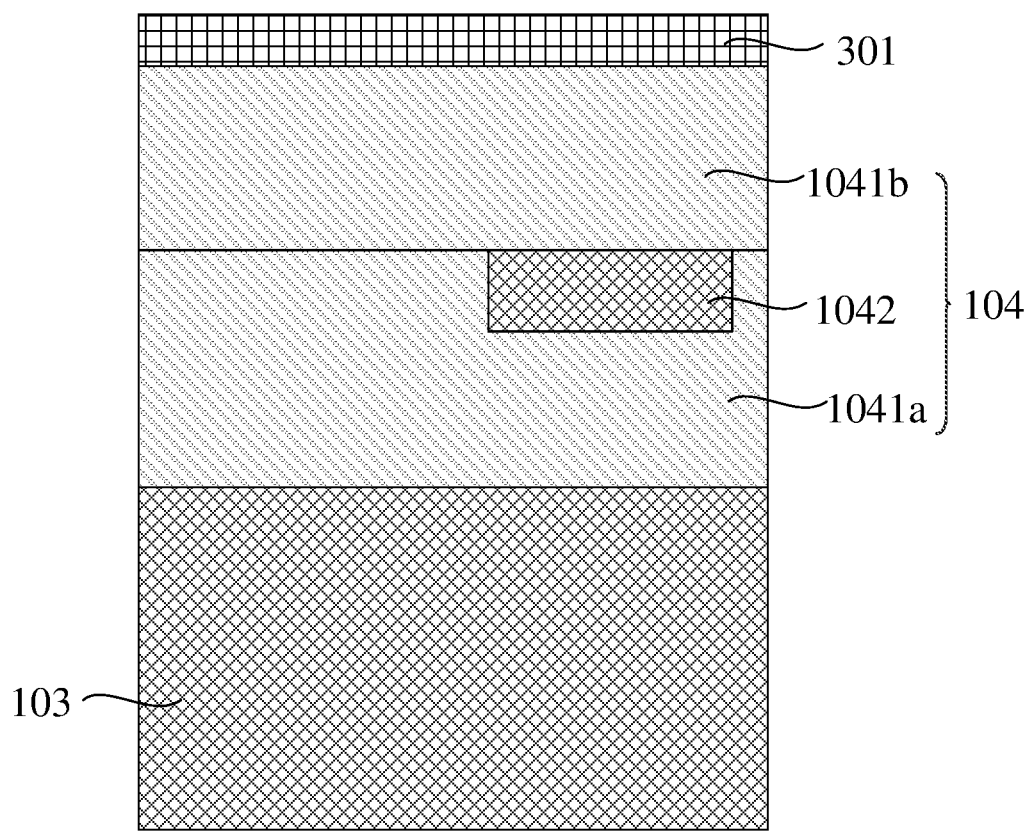
FIG. 3A to FIG. 3C are schematic diagrams illustrating a process for forming a first target pattern and a first redundant pattern in a composite hard mask layer according to embodiments of the disclosure.

As shown in FIG. 3A, a second photoresist layer 301 is formed on the composite hard mask layer 104.

Here, the second photoresist may be the same as the first photoresist and may also be different from the first photoresist.

At S1022, the second photoresist layer is patterned to form an initial first target pattern and an initial first redundant pattern, in which the critical dimension of the initial first target pattern is greater than the critical dimension of the initial first redundant pattern in the direction parallel to the top surface of the composite hard mask layer.

Figure 3B:
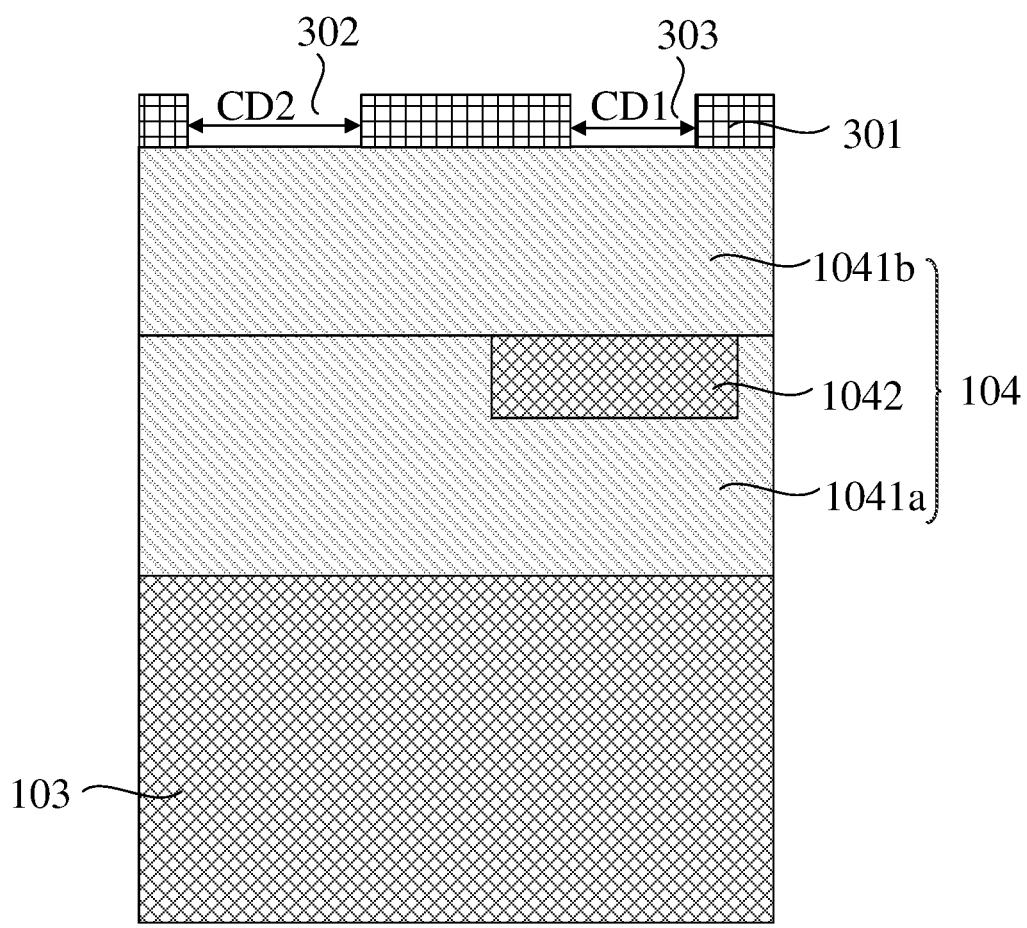

As shown in FIG. 3B, the second photoresist layer 301 is patterned to form an initial first target pattern 302 and an initial first redundant pattern 303. The critical dimension CD2 of the initial first target pattern 302 is greater than the critical dimension CD1 of the initial first redundant pattern 303 in the direction parallel to the top surface of the composite hard mask layer 104.

At S1023, the composite hard mask layer is etched by using the initial first target pattern and the initial first redundant pattern as masks to form the first target pattern and the first redundant pattern in the composite hard mask layer.

Figure 3C:
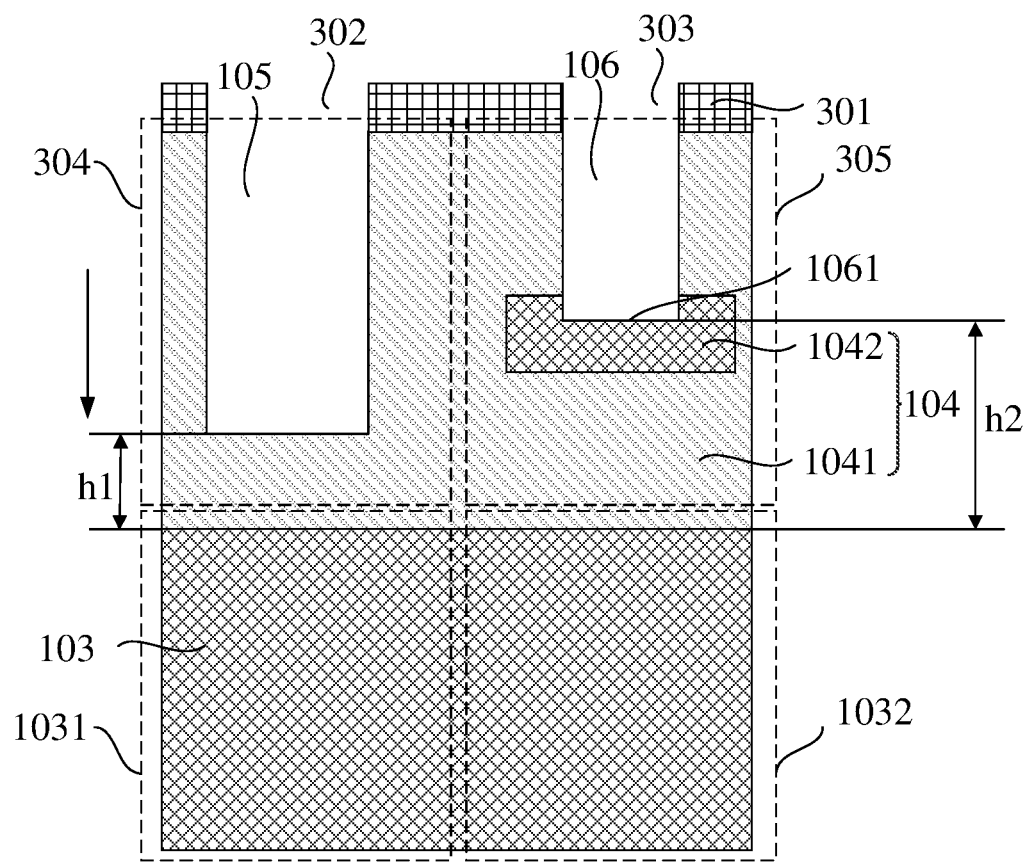

As shown in FIG. 3B, the composite hard mask layer 104 is etched by using the initial first target pattern 302 and the initial first redundant pattern 303 as masks to form the first target pattern 105 and the first redundant pattern 106 shown in FIG. 3C in the composite hard mask layer 104.

In some embodiments, in the operation of etching the composite hard mask layer by using the initial first target pattern and the initial first redundant pattern as masks, the etching rate for the etching stop layer is less than the etching rate for the hard mask layer. Thus, the formed first redundant pattern may be stopped on the etching stop layer without affecting the formation of the target structure of the etching layer located below the etching stop layer. In some embodiments, the etching rate may be adjusted by adjusting the composition and proportion of the materials of the etching stop layer and the hard mask layer.

In some embodiments, as shown in FIG. 3C, the etching layer 103 includes an etching area 1031 and a non-etching area 1032. Accordingly, the implementation of S1023 may include the following operations. A first target pattern 105 is formed in a first preset area 304 and a first redundant pattern 106 is formed in a second preset area 305. Herein, the first preset area 304 is an area of the hard mask layer 1041 facing the etching area 1031 in the direction perpendicular to the etching layer 103, and the second preset area 305 is an area of the hard mask layer 1041 and the etching stop layer 1042 facing the non-etching area 1032 in the direction perpendicular to the etching layer 103.

In the embodiment of the disclosure, dividing the etching layer into the etching area and the non-etching area facilitates determination of the position of the first target pattern and the position of the first redundant pattern.

At S1024, the second photoresist layer is removed.

As shown in FIG. 3C, the second photoresist layer 301 is removed to form a structure shown in FIG. 2F.

In the embodiment of the disclosure, the second photoresist layer is formed on the composite hard mask layer, and after the second photoresist layer is patterned, the first target pattern and the first redundant pattern are formed.

Description is made below to a method for preparing another semiconductor structure provided by the embodiments of the disclosure with reference to the drawings. The method includes the following operations.

At a first operation, as shown in FIG. 2D, an initial first hard mask layer 10411 is formed on the etching layer 103.

At a second operation, as shown in FIG. 2E, a first photoresist layer 114 is formed on the initial first hard mask layer 10411; and as shown in FIG. 2F, a first photoresist layer 114 is patterned to from a first etching stop layer pattern 115.

At a third operation, as shown in FIG. 2F, the initial first hard mask layer 10411 is etched by using the first etching stop layer pattern 115 as a mask to form a first hard mask layer 1041a and an etching stop layer trench 113 located in the first hard mask layer 1041a shown in FIG. 2G.

At a fourth operation, as shown in FIG. 2G, the first photoresist layer 114 is removed, to sequentially form a first hard mask layer 1041a and an etching stop layer trench 113 on the etching layer 103 as shown in FIG. 2C.

At a fifth operation, as shown in FIG. 2C, an initial etching stop layer 10421 shown in FIG. 2H is deposited in the etching stop layer trench 113 and on the top surface of the first hard mask layer 1041a.

At a sixth operation, as shown in FIG. 2H, the initial etching stop layer 10421 located on the top surface of the first hard mask layer 1041a is removed, so that the top surface of a remaining part of the initial etching stop layer 10421 is flush with the top surface of the first hard mask layer 1041a to form the etching stop layer 1042 shown in FIG. 2A.

At a seventh operation, as shown in FIG. 2B, a second hard mask layer 1041b is formed on the top surface of the first hard mask layer 1041a and the top surface of the etching stop layer 1042, to form a composite hard mask layer 104 located on the etching layer 103. Herein, the composite hard mask layer 104 includes the first hard mask layer 1041a, the etching stop layer 1042 and the second hard mask layer 1041b.

At an eight operation, as shown in FIG. 3A, a second photoresist layer 301 is formed on the composite hard mask layer 104. As shown in FIG. 3B, the second photoresist layer 301 is patterned to form an initial first target pattern 302 and an initial first redundant pattern 303. The critical dimension CD2 of the initial first target pattern 302 is greater than the critical dimension CD1 of the initial first redundant pattern 303 in the direction parallel to the top surface of the composite hard mask layer 104.

At a ninth operation, as shown in FIG. 3B, the composite hard mask layer 104 is etched by using the initial first target pattern 302 and the initial first redundant pattern 303 as masks; and as shown in FIG. 3C, the second photoresist layer 301 is removed to form a structure in which the first target pattern 105 and the first redundant pattern 106 are formed in the composite hard mask layer 104 shown in FIG. 1F.

At a tenth operation, as shown in FIG. 1F, a remaining part of the etching stop layer 1042 is removed to form the second target pattern 107 and the second redundant pattern 108 shown in FIG. 1G in the hard mask layer 1041. As shown in FIG. 1G, the hard mask layer 1041 is etched by using the second target pattern 107 as a mask to form the third target pattern 111 as shown in FIG. 1I in the hard mask layer 1041. As shown in FIG. 1I, the third target pattern 111 penetrates through the hard mask layer 1041 in the direction perpendicular to the hard mask layer 1041 (that is, the direction indicated by the arrow in FIG. 1I, or the direction indicated by an upward arrow). As shown in FIG. 1G, the hard mask layer 1041 is etched by using the second redundant pattern 108 as a mask to form the third redundant pattern 112 shown in FIG. 1I in the hard mask layer 1041. As shown in FIG. 1I, in the direction perpendicular to the hard mask layer 1041 (that is, the direction indicated by the arrow in FIG. 1I, or the direction indicated by an upward arrow), the third redundant pattern 112 is located in the hard mask layer 1041 and penetrates through a fourth part of the hard mask layer 1041.

At an eleventh operation, as shown in FIG. 1I, the etching layer 103 is etched by using the third target pattern 111 as a mask to form the target structure 109 as shown in FIG. 1H in the etching layer 103. As shown in FIG. 1I, the hard mask layer 1041 is etched by using the third redundant pattern 112 as a mask to form the redundant structure 110 as shown in FIG. 1H in the hard mask layer 1041. In the direction perpendicular to the hard mask layer 1041 (that is, the direction indicated by the arrow in FIG. 1H, or the direction indicated by an upward arrow), the redundant structure 110 is located in the hard mask layer 1041 and penetrates through a fifth part of the hard mask layer 1041.

At a twelfth operation, the remaining part of the hard mask layer 1041 shown in FIG. 1H is removed to obtain the etching layer 103 containing the target structure 109 shown in FIG. 1J.

The embodiments of the disclosure provide a semiconductor structure, which is prepared by the above method for preparing the semiconductor structure.

The embodiments of the disclosure provide a semiconductor structure and a method for preparing a semiconductor structure. The method includes the following operations. A composite hard mask layer is formed on an etching layer, in which the composite hard mask layer includes a hard mask layer and an etching stop layer surrounded by the hard mask layer. A first target pattern and a first redundant pattern are formed in the composite hard mask layer. The first target pattern is completely located in the hard mask layer and the first target pattern penetrates through a first part of the hard mask layer in a direction perpendicular to the hard mask layer. The bottom of the first redundant pattern is located in the etching stop layer, and the first redundant pattern penetrates through a part of the etching stop layer in a direction perpendicular to the etching stop layer. A remaining part of the etching stop layer is removed to form a second target pattern and a second redundant pattern in the hard mask layer. Etching is performed by using the second target pattern and the second redundant pattern as masks to form a target structure in the etching layer and to form a redundant structure in the hard mask layer. A remaining part of the hard mask layer is removed. Thus, in the first aspect, by embedding the etching stop layer in the hard mask layer and forming the first redundant pattern in the etching stop layer, the first redundant pattern may be stopped in the etching stop layer under the action of the etching stop layer. In the second aspect, after the first redundant pattern is formed, the etching stop layer is removed, which may reduce the pollution of the etching stop layer to a subsequent process. In the third aspect, by introducing a redundant structure, the load effect in the etching process may be reduced in the process of etching a high aspect ratio structure on the semiconductor structure.

The characteristics disclosed in the several method or structure embodiments provided in the present disclosure may be arbitrarily combined with each other without conflict to obtain a new method embodiment or structure embodiment.

Descriptions about the above embodiments of the semiconductor structure are similar to descriptions about the method embodiment and beneficial effects similar to those of the method embodiment are achieved. Technical details undisclosed in the semiconductor structure embodiment of the disclosure are understood with reference to the descriptions about the method embodiment of the disclosure.

The above is only exemplary embodiments of the disclosure and not intended to limit the scope of protection of the disclosure. Any modifications, equivalent replacements, improvements and the like made within the spirit and principle of the disclosure shall fall within the scope of protection of the disclosure.

The invention claimed is:

1. A method for preparing a semiconductor structure, comprising:
    forming a composite hard mask layer on an etching layer, the composite hard mask layer comprising a hard mask layer and an etching stop layer surrounded by the hard mask layer;
    forming a first target pattern and a first redundant pattern in the composite hard mask layer, wherein the first target pattern is completely located in the hard mask layer and the first target pattern penetrates through a first part of the hard mask layer in a direction perpendicular to the hard mask layer, a bottom of the first redundant pattern is located in the etching stop layer, and the first redundant pattern penetrates through a part of the etching stop layer in a direction perpendicular to the etching stop layer;
    removing a remaining part of the etching stop layer to form a second target pattern and a second redundant pattern in the hard mask layer;
    performing etching by using the second target pattern and the second redundant pattern as masks to form a target structure in the etching layer and to form a redundant structure in the hard mask layer; and
    removing a remaining part of the hard mask layer.

2. The method for preparing the semiconductor structure of claim 1, wherein the hard mask layer comprises a first hard mask layer and a second hard mask layer, wherein forming the composite hard mask layer on the etching layer, the composite hard mask layer comprising the hard mask layer and the etching stop layer surrounded by the hard mask layer comprises:
    sequentially forming the first hard mask layer and the etching stop layer on the etching layer, wherein the etching stop layer is embedded in the first hard mask layer, and a top surface of the first hard mask layer is flush with a top surface of the etching stop layer; and
    forming the second hard mask layer, which covers the top surface of the first hard mask layer and the top surface of the etching stop layer, to form the composite hard mask layer located on the etching layer.

3. The method for preparing the semiconductor structure of claim 2, wherein the sequentially forming the first hard mask layer and the etching stop layer on the etching layer comprises:
    sequentially forming the first hard mask layer and an etching stop layer trench on the etching layer, wherein the etching stop layer trench is located in the first hard mask layer; and
    depositing an etching stop layer completely filling the etching stop layer trench in the first hard mask layer.

4. The method for preparing the semiconductor structure of claim 3, wherein sequentially forming the first hard mask layer and the etching stop layer trench on the etching layer comprises:
    forming an initial first hard mask layer on the etching layer;
    forming a first photoresist layer on the initial first hard mask layer;
    patterning the first photoresist layer to form a first etching stop layer pattern;
    etching the initial first hard mask layer by using the first etching stop layer pattern as a mask to form the first hard mask layer and the etching stop layer trench located in the first hard mask layer; and removing the first photoresist layer.

5. The method for preparing the semiconductor structure of claim 3, wherein depositing the etching stop layer completely filling the etching stop layer trench in the first hard mask layer comprises:

depositing an initial etching stop layer in the etching stop layer trench and on the top surface of the first hard mask layer; and removing the initial etching stop layer located on the top surface of the first hard mask layer, so that a top surface of a remaining part of the initial etching stop layer is flush with the top surface of the first hard mask layer to form the etching stop layer.

6. The method for preparing the semiconductor structure of claim 1, wherein a critical dimension of the first target pattern is greater than a critical dimension of the first redundant pattern in a direction parallel to a bottom surface of the composite hard mask layer, and wherein a first distance between a bottom of the first target pattern and the bottom surface of the composite hard mask layer being less than a second distance between the bottom of the first redundant pattern and the bottom surface of the composite hard mask layer.

7. The method for preparing the semiconductor structure of claim 1, wherein a critical dimension of the first redundant pattern is less than a critical dimension of the etching stop layer in a direction parallel to a bottom surface of the composite hard mask layer.

8. The method for preparing the semiconductor structure of claim 1, wherein a first distance between a bottom of the first target pattern and a bottom surface of the composite hard mask layer is less than a third distance between a bottom of the etching stop layer and the bottom surface of the composite hard mask layer.

9. The method for preparing the semiconductor structure of claim 1, wherein forming the first target pattern and the first redundant pattern in the composite hard mask layer comprises:

forming a second photoresist layer on the composite hard mask layer;

patterning the second photoresist layer to form an initial first target pattern and an initial first redundant pattern, wherein a critical dimension of the initial first target pattern is greater than a critical dimension of the initial first redundant pattern in a direction parallel to a top surface of the composite hard mask layer;

etching the composite hard mask layer by using the initial first target pattern and the initial first redundant pattern as masks to form the first target pattern and the first redundant pattern in the composite hard mask layer; and removing the second photoresist layer.

10. The method for preparing the semiconductor structure of claim 9, wherein the etching layer comprises an etching area and a non-etching area, wherein the etching the composite hard mask layer by using the initial first target pattern and the initial first redundant pattern as masks comprises:

forming the first target pattern in a first preset area and forming the first redundant pattern in a second preset area, wherein the first preset area is an area of the hard mask layer facing the etching area in a direction perpendicular to the etching layer, and the second preset area is an area of the hard mask layer and the etching stop layer facing the non-etching area in the direction perpendicular to the etching layer.

11. The method for preparing the semiconductor structure of claim 1, wherein an orthographic projection of the first redundant pattern is located within a range of orthographic projection of a pattern of the etching stop layer in a direction perpendicular to the etching layer.

12. The method for preparing the semiconductor structure of claim 9, wherein in the operation of the etching the composite hard mask layer by using the initial first target pattern and the initial first redundant pattern as masks, an etching rate for the etching stop layer is less than an etching rate for the hard mask layer.

13. The method for preparing the semiconductor structure of claim 1, wherein removing the remaining part of the etching stop layer comprises:

removing the remaining part of the etching stop layer by a wet etching process.

14. The method for preparing the semiconductor structure of claim 13, wherein in the wet etching process, an etching rate for the etching stop layer is greater than an etching rate for the hard mask layer, wherein in the direction perpendicular to the hard mask layer, the second target pattern penetrates through a second part of the hard mask layer, and the second redundant pattern penetrates through a third part of the hard mask layer.

15. The method for preparing the semiconductor structure of claim 1, wherein performing etching by using the second target pattern and the second redundant pattern as masks to form the target structure in the etching layer and to form the redundant structure in the hard mask layer comprises:

performing etching by using the second target pattern and the second redundant pattern as masks, comprising: etching the hard mask layer by using the second target pattern as a mask to form a third target pattern in the hard mask layer, wherein the third target pattern penetrates through the hard mask layer in the direction perpendicular to the hard mask layer; and etching the hard mask layer by using the second redundant pattern as a mask to form a third redundant pattern in the hard mask layer, wherein the third redundant pattern is located in the hard mask layer and penetrates through a fourth part of the hard mask layer in the direction perpendicular to the hard mask layer; and performing etching with the third target pattern and the third redundant pattern as masks, comprising: etching the etching layer by using the third target pattern as a mask to form the target structure in the etching layer; and etching the hard mask layer by using the third redundant pattern as a mask to form the redundant structure in the hard mask layer, wherein the redundant structure is located in the hard mask layer and penetrates through a fifth part of the hard mask layer in the direction perpendicular to the hard mask layer.

16. The method for preparing the semiconductor structure of claim 15, wherein in the operation of performing etching by using the third target pattern and the third redundant pattern as masks, an etching rate for the etching layer is greater than an etching rate for the hard mask layer.

17. The method for preparing the semiconductor structure of claim 1, wherein a material of the etching stop layer comprises at least one of silicon oxide, silicon nitride, aluminum oxide or borophosphosilicate glass.

18. The method for preparing the semiconductor structure of claim 17, wherein the hard mask layer comprises a first hard mask layer and a second hard mask layer, wherein a material of the first hard mask layer comprises at least one of carbon, silicon nitride, titanium nitride or silicon oxide;

a material of the second hard mask layer comprises at least one of carbon, silicon nitride, titanium nitride or silicon oxide; and the material of the etching stop layer is different from the material of the first hard mask layer and the material of the second hard mask layer.

\* \* \* \* \*